(12) United States Patent
Karlquist

(10) Patent No.: US 7,173,995 B2
(45) Date of Patent: Feb. 6, 2007

(54) SYSTEMS AND METHODS FOR CORRECTING GAIN ERROR DUE TO TRANSITION DENSITY VARIATION IN CLOCK RECOVERY SYSTEMS

(75) Inventor: Richard K. Karlquist, Cupertino, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 846 days.

(21) Appl. No.: 10/328,298

(22) Filed: Dec. 23, 2002

(65) Prior Publication Data
US 2004/0120441 A1 Jun. 24, 2004

(51) Int. Cl.
H03D 3/24 (2006.01)
(52) U.S. Cl. ...................................... 375/376
(58) Field of Classification Search ................. 375/375
See application file for complete search history.

(56) References Cited

U.S. PATENT DOCUMENTS 4,787,097 A * 11/1988 Rizzo ........................ 375/375
5,430,772 A * 7/1995 Lee et al. .................... 375/363

FOREIGN PATENT DOCUMENTS

EP 0 862 272 9/1998
EP 0 585 090 3/2004

OTHER PUBLICATIONS

U.S. Appl. No. 10/328,304, Karlquist.
U.S. Appl. No. 10/328,358, Karlquist.
U.S. Appl. No. 10/328,363, Karlquist.
Armstrong, Edwin H, "A Method of Reducing Disturbances in Radio Signaling by a System of Frequency Modulation", Proc. IRE, vol. 24, No. 5, May 1936, p. 689ff.
Jaffe, D.L., "Armstrong's Frequency Modulator", Proc. IRE, vol. 26, No. 4, Apr. 1938, p. 475 481.

* cited by examiner

Primary Examiner—Temesghen Ghebretinsae
Assistant Examiner—Juan Alberto Torres

(57) ABSTRACT

In one embodiment, the present invention is directed to a system for processing a data stream. The system comprises: a voltage controlled oscillator (VCO) that generates a VCO signal in response to a tuning signal; a phase detector that generates an error signal that is indicative of a phase difference between a data signal and the VCO signal; a first filter that filters a reference signal that is indicative of an occurrence of a data transition; a second filter that filters the error signal, wherein the first filter and second filter are low-pass filters that possess a bandwidth that approximately equals one half of the reciprocal of: a unit interval multiplied by a maximum run length; and a divider circuit that divides the filtered error signal by the filtered reference signal.

27 Claims, 4 Drawing Sheets

SYSTEMS AND METHODS FOR CORRECTING GAIN ERROR DUE TO TRANSITION DENSITY VARIATION IN CLOCK RECOVERY SYSTEMS

RELATED APPLICATIONS

The present application is related to concurrently filed, co-pending, and commonly assigned U.S. patent application Ser. No. 10/328,304, entitled "SYSTEM AND METHOD FOR DESIGNING AND USING ANALOG CIRCUITS OPERATING IN THE MODULATION DOMAIN;" U.S. patent application Ser. No. 10/328,363, entitled "PHASE LOCKED LOOP DEMODULATOR AND DEMODULATION METHOD USING FEED-FORWARD TRACKING ERROR COMPENSATION;" and U.S. patent application Ser. No. 10/328,358, entitled "SYSTEMS AND METHODS FOR CORRECTING PHASE LOCKED LOOP TRACKING ERROR USING FEED-FORWARD PHASE MODULATION;" the disclosures of which are hereby incorporated herein by reference.

TECHNICAL FIELD

The present invention is directed to processing a data stream that includes an embedded clock and, more particularly, to operating a phase locked loop (PLL) that exhibits predictable phase demodulation sensitivity in response to variation in symbol transition density.

BACKGROUND OF THE INVENTION

Non-return-to-zero (NRZ) signaling refers to a binary encoding scheme in which there is no return to a reference voltage between encoded bits. Instead, the signaling remains at a "high" voltage for consecutive "ones" and remains at a "low" voltage for consecutive "zeros." In data transmission systems that utilize NRZ signaling, it is necessary to recover the clock based on the timing of the data transitions. In general, the clock associated with a data stream is recovered utilizing a phase locked loop (PLL). By comparing the timing of data transitions in the NRZ data stream to the phase of a voltage controlled oscillator (VCO) of the PLL, the phase error of the VCO may be determined. The VCO signal is adjusted thereto thereby locking the VCO to the embedded clock of the data. Specifically, the phase error may be "servo'd" to zero utilizing closed-loop feedback via the PLL design.

FIG. 1 depicts clock recovery loop 100 according to the prior art. Clock recovery loop 100 comprises continuous phase detector 104, VCO 105, and loop filter 106. Data 101 to be measured is received by continuous phase detector 104. VCO 105 generates a VCO signal (which is provided as recovered clock 102) that is controlled by tuning voltage 107. When a data transition occurs, continuous phase detector 104 compares the timing of the data transmission to the phase of the VCO signal. Continuous phase detector 104 is referred to as "continuous," because it produces phase error 103 that is proportional to the difference between the timing of the data transition and the phase of the VCO signal (as opposed to a quantized or binary output that merely indicates "early versus late" but not by how much). Phase error 103 is filtered by loop filter 106 to generate tuning voltage 107 to provide the closed-loop feedback.

However, for random data, the transition from "one" to "zero," or vice versa, is a random event. Thus, there is some uncertainty whether and when a transition will occur. For example, if the data is "01010100000000001," for the first six bits, there will be a transition at every opportunity, because no two consecutive bits are the same. However, the next ten consecutive bits are all "zero." A "run length" refers to the number of consecutive bits or symbols that occur without a transition. Accordingly, the example data stream has a run length of ten "zeros." During the run length of symbols or bits, no transition occurs from "zero" to "one." Since there is no transition during the period, there is no phase information available from the data to correct any phase error in the VCO. Furthermore, data may be communicated in a "run length limited" manner (e.g., for jitter measurements). Specifically, the permissible run length of applied data patterns must be less than some predetermined number. A typical run length limit applied to data for which the jitter is measured is 31 bits.

In general, phase detectors work by outputting phase information only when there is a transition. When there is no transition in the data (at least two consecutive symbols that are the same), known phase detectors output a zero (i.e., meaning there is no detected phase error). This characteristic has the effect of making the phase detector gain (e.g., radians/volt), a function of the transition density of the data pattern. Thus, the phase detector gain is high during the "010101" portion of the example data stream and the phase detector gain is low during the "00000000001" portion of the example data stream.

Unpredictable phase detector gain has at least two important deleterious effects. First, the PLL bandwidth becomes unpredictable, because the PLL bandwidth is directly proportional to the phase detector gain. This degrades loop performance (e.g., tracking error), which makes the loop more difficult to design. Secondly, in jitter measurements, the calibration factor is directly proportional to the phase detector gain. Thus, the accuracy of the jitter measurement is questionable, when the data being measured does not have a predictable transition density. However, it is typically advantageous to utilize a wide variety of data patterns with appreciable variation in transition density in jitter measurements.

BRIEF SUMMARY OF THE INVENTION

In embodiments in accordance with the invention, a PLL is adapted such that the resulting phase error generated by the PLL is independent of the transition density of a data stream provided to the PLL. Specifically, the data stream may be considered to be a stream of symbols or bits that transition from one state to another according to a random sequence. Symbols or bits of the data stream are communicated in discrete intervals of time ("unit intervals"). Also, the data stream is communicated according to a run length limit that places an upper limit upon the number of consecutive symbols or bits that occur without a transition to another symbol or bit. The PLL may be adapted by filtering the phase error from a continuous phase detector of the PLL utilizing a first filter. A reference signal that is indicative of whether data transition has just occurred may be filtered by a second filter. The first and second filters may be advantageously implemented as low-pass filters that have a bandwidth that approximately equals one half of the reciprocal of the unit interval multiplied by the maximum run length. The output of the first and second filters may be provided to a divider circuit to produce a signal that is indicative of the phase error independent of the data transition density.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
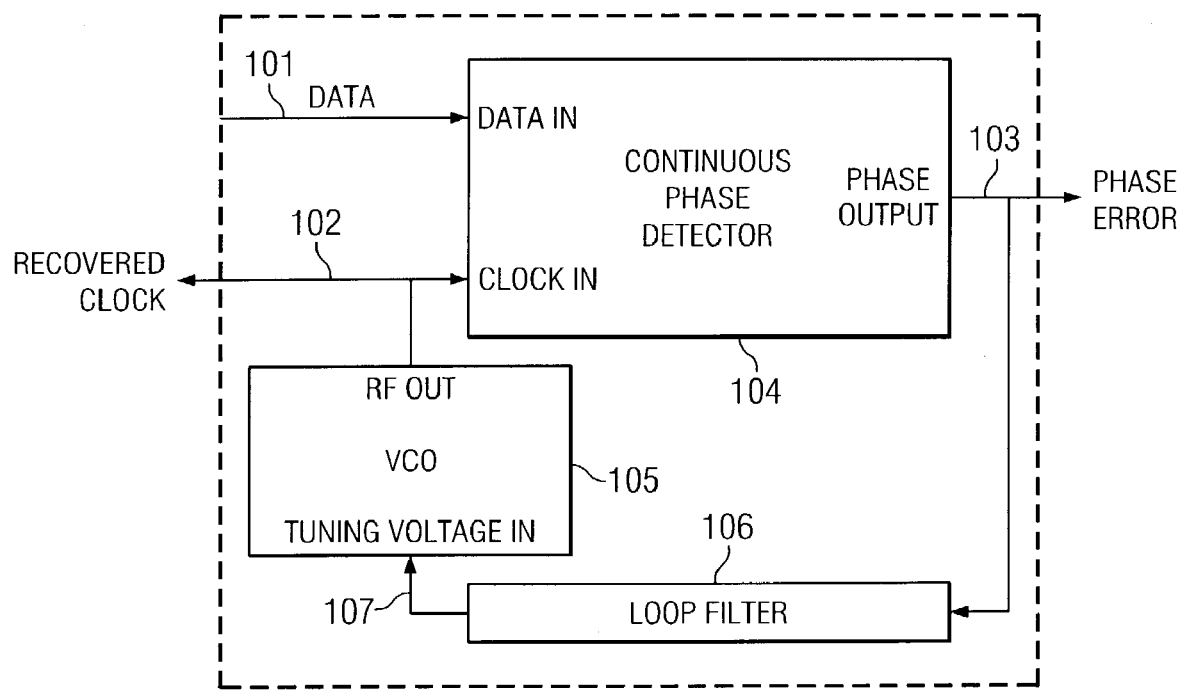
FIG. 1 depicts a clock recovery circuit according to the prior art.

Before discussing embodiments in accordance with the invention in greater detail, a discussion of Nyquist's sampling theorem is presented for the convenience of the reader. The Nyquist sampling theorem is related to the problem of reconstructing a continuous analog waveform utilizing only discrete samples of that waveform's voltage taken at uniform time intervals. In Nyquist's sampling theorem, an assumption is made that the continuous analog waveform is bandlimited, meaning that there are no frequencies contained in the waveform that exceed an upper bound frequency (which defines the Nyquist bandwidth). Utilizing this assumption, Nyquist was able to prove that the continuous analog waveform can be perfectly reconstructed from these samples, if and only if the sampling rate is at least twice the Nyquist bandwidth. This sampling rate is referred to as the Nyquist rate. In practice, a phenomenon known as "aliasing" requires the sampling rate to be slightly higher than Nyquist's theoretical minimum rate.

A familiar example is the digital audio compact disc (CD) format. Analog audio is typically filtered by a low-pass filter such that the analog audio does not possess a frequency component that is greater than 20 kHz. The analog audio is then sampled at a rate of 44,100 samples per second. This sampling rate is slightly (~10%) greater than the Nyquist rate of 40,000 samples/per second.

As previously noted, Nyquist's sampling theorem assumes a uniform sampling rate. Embodiments in accordance with the invention extend Nyquist's sampling theorem to non-uniform sampling. For the convenience of further discussion, the term "pseudo-rate" shall be used to refer to the minimum sampling rate (as defined by the maximum time between consecutive samples) in a sampling set having a variable rate. It is submitted that perfect reconstruction of a continuous analog waveform is possible from samples taken at a variable rate, if the pseudo-rate is at least as high as the Nyquist rate (which is twice the highest frequency component of the continuous analog waveform). In a sense, in a variable sampling application that satisfies this criterion, there are "surplus" samples (e.g., samples taken at a rate higher than the Nyquist rate) available to facilitate recovery of the continuous analog waveform. These surplus samples may average out any non-systematic errors made by the sampling functionality.

A specific example may illustrate the concept of the pseudo-rate. Suppose a data transmission system with a data rate of 40 gigabits/sec (40 Gb/s) is tested for jitter using a data pattern with a run length limit of 32 (chosen for mathematical simplicity). Each bit occupies 25 ps which is referred to as the "unit interval" (UI). Since at least one data transition must occur every 32 symbols, the maximum time between samples of a phase error signal from a phase detector is 32×25 ps or 800 ps. A time interval of 800 ps corresponds to a pseudo-rate of 1.25 gigasamples/sec (which is the reciprocal of $800 \times 10^{-12}$ sec). Thus, the pseudo-rate supports a bandwidth of 625 MHz according to the present extension of the Nyquist sampling theorem. The bandwidth supported by the pseudo-rate will be referred to as the pseudo-Nyquist bandwidth.

Figure 2:
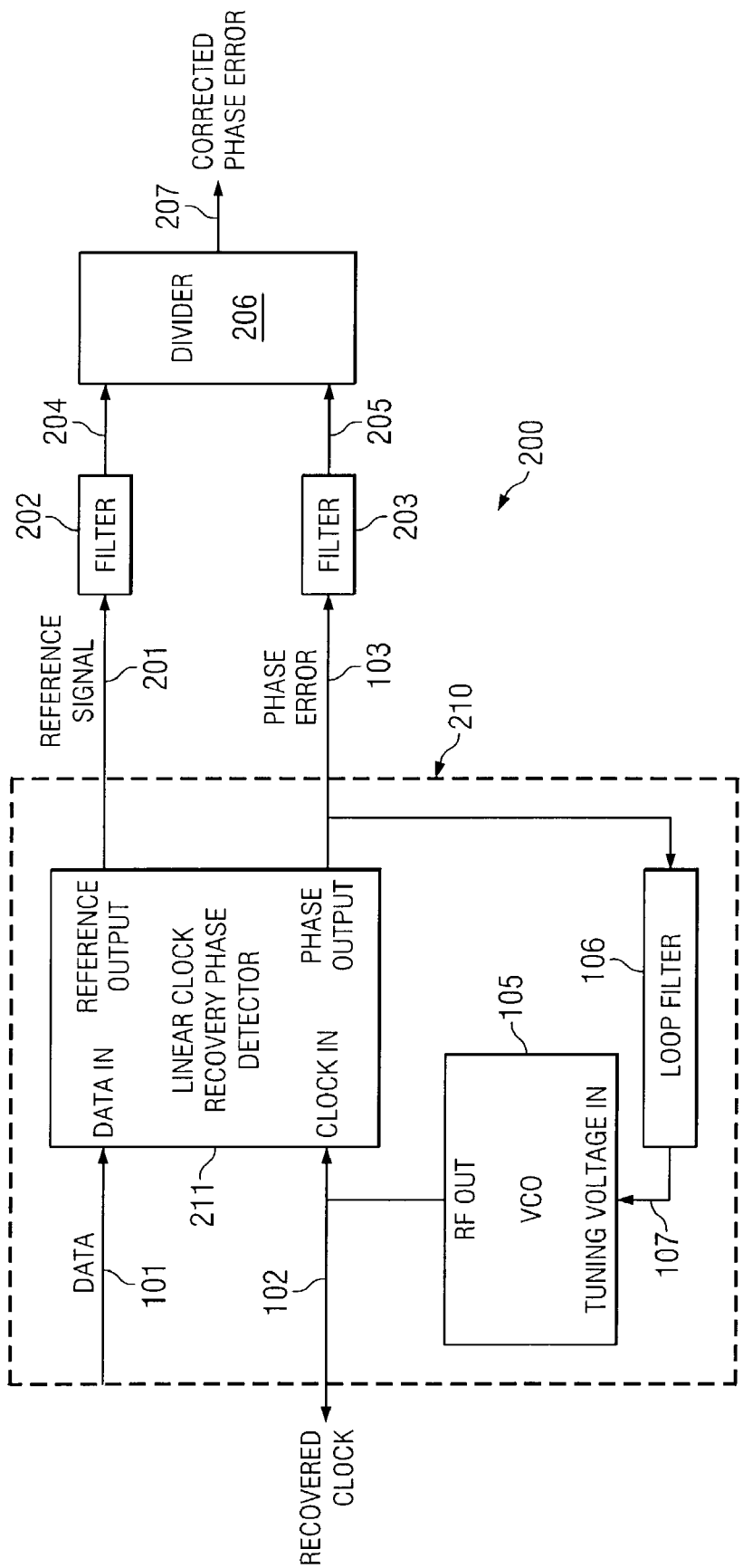
FIG. 2 depicts a clock recovery circuit according to embodiments in accordance with the invention.

FIG. 2 depicts system 200 that is adapted according to the pseudo-Nyquist bandwidth according to embodiments in accordance with the invention. System 200 comprises conventional clock recovery loop 210. Conventional clock recovery loop 210 is almost the same as conventional clock recovery loop 100 except continuous phase detector 211 is modified. Continuous phase detector 211 comprises a first port to output phase error 103 and, additionally, a second port to output reference signal 201 that is indicative of a data transition. In embodiments in accordance with the invention, continuous phase detector 211 produces a pulse of one UI duration each time a data transition occurs on the second port. As shown in FIG. 2, the functionality that produces the pulse during a data transition is implemented integrally with continuous phase detector 211. However, this functionality may be implemented as a discrete circuit element if desired.

Reference signal 201 is provided to filter 202. Filter 202 filters reference signal 201 to produce signal 204 which is approximately proportional to the transition density associated with data 101. Filter 202 may be implemented as a low-pass filter that integrates the pulses generated by phase detector 211. In embodiments in accordance with the invention, filter 202 may be implemented as a low-pass filter that possesses a cut-off frequency that approximately (considering aliasing effects) equals the pseudo-Nyquist bandwidth. As previously noted, the pseudo-Nyquist bandwidth is defined by the maximum time between samples which, in turn, may be defined by the run length limit associated with data 101. Also, in embodiments in accordance with the invention, filter 202 may be advantageously implemented to possess well-behaved time domain characteristics (i.e., low under/overshoot). Suitable filters include Bessel filters and Gaussian filters. Similarly, phase error 103 from continuous phase detector 211 is provided to filter 203. Filter 203 may be implemented in the same manner as filter 202.

The outputs (signal 204 and signal 205) from filters 202 and 203 are provided to divider 206 (which may be an analog or digital circuit element). Divider 206 divides the filtered phase error signal (signal 205) by the filtered reference signal 202 to produce corrected phase error 207. This configuration has an advantage in terms of utilizing a PLL as a phase demodulator to recover and measure jitter. Corrected phase error 207 has ajitter sensitivity that is independent of data transition density or run length. In contrast, raw phase error 103 has a sensitivity that is directly proportional to transition density.

Although system 200 has been described as generating a VCO signal, the present invention is not so limited. Embodiments in accordance with the invention may be implemented in a system in which the VCO signal is independently available and the phase detector with gain correction is used in an open loop.

Also, for the convenience of the reader, a mathematical analysis of system 200 is provided. Let $D_{ma}(t)$ (which corresponds to signal 204) be defined as a moving average consisting of the number of transitions occurring in a length of time equal to the pseudo-Nyquist period (the reciprocal of the pseudo-Nyquist rate). Then, it follows from the definition of the pseudo-Nyquist period, that $D_{ma}(t)$ has a minimum value of 1 and a maximum value equal to the run length limit. Let $\Phi_{ma}(t)$ denote a similar moving average of the phase error, where the moving averages are over the same time interval. Then, the filtered phase error (phase error 203) is given by $\Phi_{ma}(t) D_{ma}(t)$. Thus, dividing $\Phi_{ma}(t) D_{ma}(t)$ by $D_{ma}(t)$ gives $\Phi_{ma}(t)$ which is the desired result (i.e., the phase error independent of transition density). System 200 does not strictly function utilizing moving averages, because the filtering may typically be performed using Bessel or Gaussian filters. However, the operational principle remains the same. Additionally, it is noted that embodiments in accordance with the invention may advantageously implement filters 202 and 203 as $3^{rd}$ order Bessel filters, because the resulting impulse response is positive for times of interest. This is advantageous, because other filter shapes typically have an impulse response with a significant negative region, from which it follows that the output must approach and cross through zero. Divider 206 will not function properly if its divisor is equal to or approximately equal to zero, because the required output voltage will exceed the dynamic range of divider 206.

Figure 3:
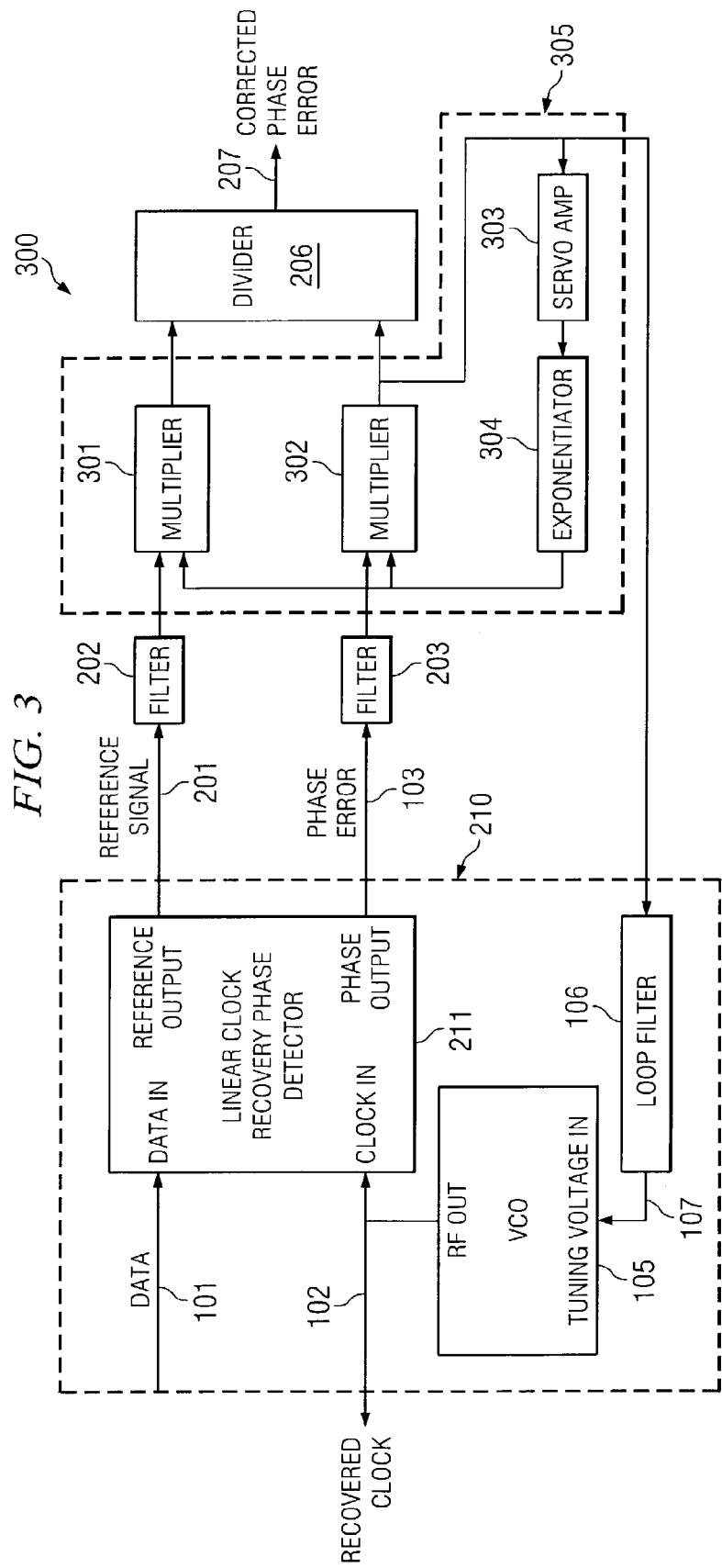
FIG. 3 depicts another clock recovery circuit according to embodiments in accordance with the invention.

It shall be appreciated that the implementation of a high speed divider (such as an analog divider) can be challenging, especially when the dynamic range of the divider is increased for a particular application. If an ideal moving average were utilized, the dynamic range would be equal to the run length limit. The dynamic range exhibited by an implementation that uses Bessel filters is somewhat less than the dynamic range of an ideal moving average, although the dynamic range is still relatively substantial. The difficulty associated with implementation of a divider may be mitigated if the dynamic range were reduced. FIG. 3 depicts system 300 which reduces the dynamic range according to embodiments in accordance with the invention.

System 300 of FIG. 3 is similar to system 200 except that system 300 includes automatic gain control (AGC) block 305. AGC block 305 is disposed after filters 202 and 203 which provide reference signal 201 and phase error signal 103. Matched multipliers 301 and 302 are inserted after filters 202 and 203 and before divider 206. The first input of multiplier 301 is the filtered reference signal from filter 202 and the first input of multiplier 302 is the filtered phase error signal from filter 203. The second input of each multiplier is driven by a servo-loop that uses the output (the multiplied filtered phase error signal) from multiplier 302 as an error signal. The multiplied filtered phase error signal may be advantageously provided to servo-amplifier 303 and exponentiator 304. By including exponential circuit element 304, the servo-loop may be linearized thereby making the loop gain independent of the incoming signal levels. Although exponentiator 304 is shown as a separate element, in practice, exponentiator 304 may be combined with each of multipliers 301 and 302. A commonly available 2-quadrant multiplier circuit consists of a differential pair biased by a current mirror. Adding an exponentiation function involves replacing the current mirror with a single transistor thereby resulting in reduced complexity.

At first glance, it may appear that the modification shown in FIG. 3 has merely traded off the difficulty in implementing a divider for the equally difficult task of implementing the multipliers. However, there is actually a net decrease in difficulty. The total dynamic range may be partitioned between the AGC block 305 and divider 206. Accordingly, neither of these elements are required to handle the entire dynamic range. Additionally, the implementation of multipliers 301 and 302 need not cause multipliers 301 and 302 to be especially accurate. Servo-loop errors are common mode, and, hence do not affect the ratio of the multiplied signals. Specifically, if multipliers 301 and 302 are matched, then any multiplication errors drop out after the operation of divider 206. Furthermore, it is relatively straight-forward to obtain matching between multipliers 301 and 302 by monolithically integrating these elements on a single integrated circuit.

Figure 4:
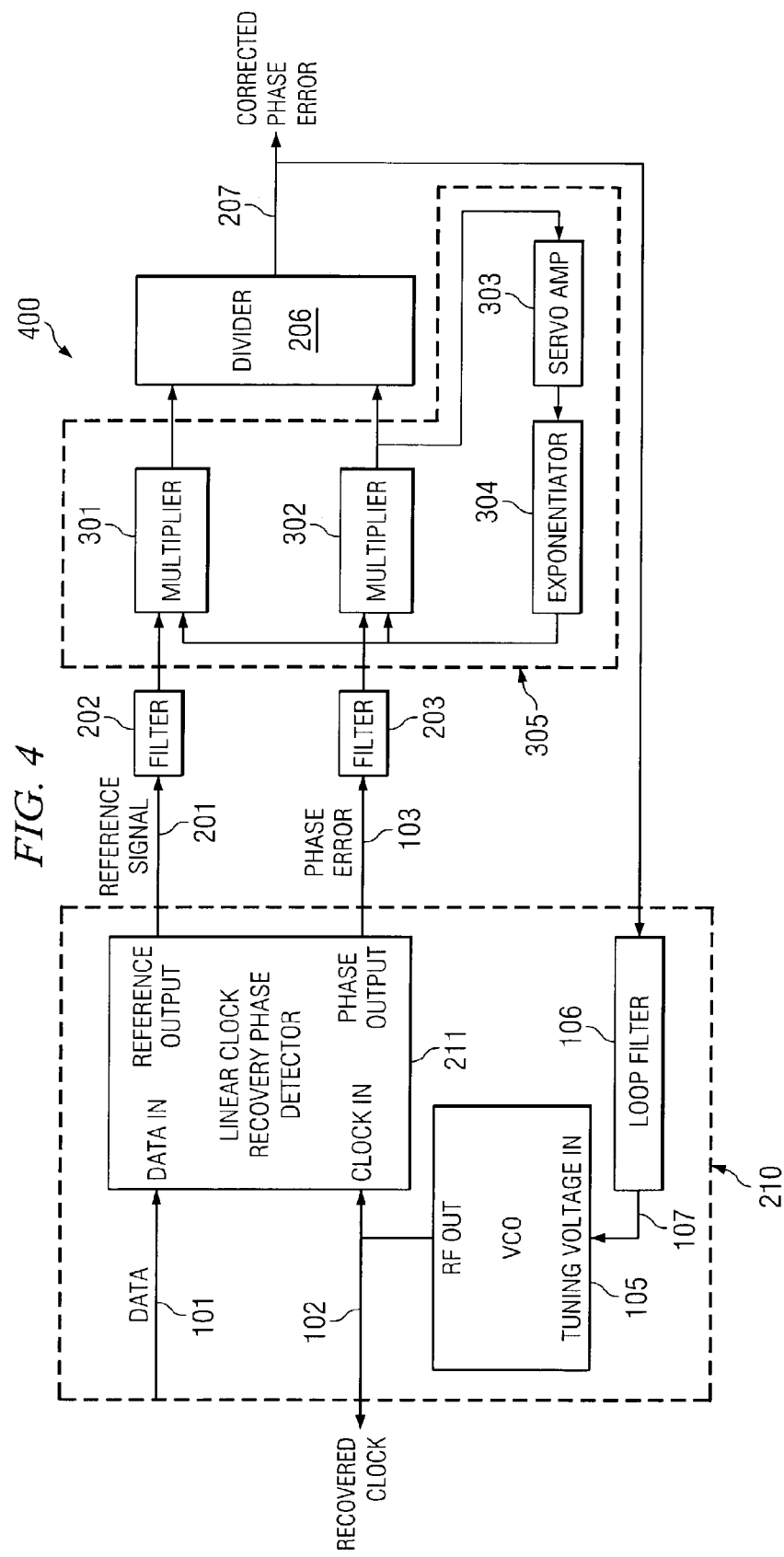
FIG. 4 depicts another clock recovery circuit according to embodiments in accordance with the invention.

FIG. 3 further depicts the output of multiplier 302 connected to provide feedback to the PLL of system 300. This stabilizes the loop gain and the loop bandwidth of the PLL (which, otherwise, would be affected by the transition density associated with data 101). In another embodiment of the present invention, additional stabilization of the loop gain and loop bandwidth may be achieved by providing corrected phase error signal 207 to loop filter 106 as shown in system 400 of FIG. 4.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for processing a data stream, comprising:
   a first low-pass filter that filters a reference signal that is indicative of an occurrence of a data transition;
   a second low-pass filter that filters a phase signal that is indicative of a phase difference between a data signal and a VCO signal from a voltage controlled oscillator (VCO); and
   a divider circuit that divides said filtered phase signal by said filtered reference signal.

2. The system of claim 1 wherein said data stream is communicated according to a unit interval and a maximum run length of consecutive symbols that occur without a transition, and wherein said first low-pass filter and second low-pass filter possess a bandwidth that approximately equals one half of the reciprocal of said unit interval multiplied by said maximum run length.

3. The system of claim 1 wherein said divider circuit outputs a corrected phase error signal and said corrected phase error signal is provided to said VCO as a tuning signal for said VCO.

4. The system of claim 1 wherein said divider circuit is an analog divider.

5. The system of claim 1 wherein said first low-pass filter and said second low-pass filter are selected from the list consisting of Bessel filters and Gaussian filters.

6. The system of claim 1 wherein said first low-pass filter integrates said reference signal to generate a signal that is proportional to a transition density associated with said data signal.

7. The system of claim 1 wherein said first low-pass filter has an impulse response such that said filtered reference signal does not approach zero.

8. The system of claim 1 wherein said first low-pass filter has an impulse response such that said filtered reference signal does not change its sign.

9. A method for processing a data stream wherein said data stream is communicated according to a unit interval and a maximum run length of consecutive symbols that occur without a transition, comprising:
    filtering a phase signal that is indicative of a phase difference between a data signal and a voltage controlled oscillator (VCO) signal;
    filtering a reference signal that is indicative of a data transition and said phase signal with respective filters that possess a bandwidth that approximately equals one half of the reciprocal of said unit interval multiplied by said maximum run length; and
    dividing said filtered phase signal by said filtered reference signal.

10. The method of claim 9 wherein said dividing is performed by an analog divider.

11. The method of claim 9 wherein said filtering is performed by filters selected from the list consisting of Bessel filters and Gaussian filters.

12. The method of claim 9 wherein said filtering integrates said reference signal to generate a signal that is proportional to a transition density associated with said data signal.

13. The method of claim 9 wherein said filtering utilizes a filter to process said reference signal according to an impulse response such that the filtered reference signal does not approach zero.

14. The method of claim 9 wherein said filtering utilizes a filter to process said reference signal according to an impulse response such that the filtered reference signal does not change its sign.

15. The method of claim 9 further comprising:
    multiplying said filtered reference signal by an automatic gain control (AGC) loop signal; and
    multiplying said filtered phase signal by said AGC loop signal, wherein said multiplying said filtered reference signal and multiplying said filtered phase signal occur before said dividing occurs.

16. The method of claim 15 further comprising:
    processing said multiplied filtered reference signal with an amplifier and an exponentiator circuit element to generate said AGC loop signal.

17. The method of claim 9 further comprising:
    utilizing a quotient signal from said dividing to provide closed-loop feedback for said VCO signal.

18. A system for processing a data stream wherein said data stream is communicated according to a unit interval and a maximum run length of consecutive symbols that occur without a transition, comprising:
    a voltage controlled oscillator (VCO) that generates a VCO signal that is related to a tuning signal;
    a phase detector that generates a phase signal that is indicative of a phase difference between a data signal and said VCO signal;
    a first filter that filters a reference signal that is indicative of an occurrence of a data transition;
    a second filter that filters said phase signal, wherein said first filter and second filter are low-pass filters that possess a bandwidth that approximately equals one half of the reciprocal of said unit interval multiplied by said maximum run length; and
    a divider circuit that divides said filtered phase signal by said filtered reference signal.

19. The system of claim 18 wherein said divider circuit is an analog divider.

20. The system of claim 18 wherein said first filter and said second filter are selected from the list consisting of Bessel filter and Gaussian filter.

21. The system of claim 18 wherein said first filter is operable to integrate said reference signal to generate a signal that is proportional to a transition density associated with said data signal.

22. The system of claim 18 wherein said first filter has an impulse response such that the filtered reference signal does not approach zero.

23. The system of claim 18 wherein said first filter has an impulse response such that the filtered reference signal does not change its sign.

24. The system of claim 18 further comprising:
    a first multiplier that multiplies said filtered reference signal by an automatic gain control (AGC) loop signal; and
    a second multiplier that multiples said filtered phase signal by said AGC loop signal, wherein said first and second multipliers are operable before said divider circuit.

25. The system of claim 24 further comprising:
    an amplifier and an exponentiator circuit element that are operable to process said multiplied filtered reference signal to generate said AGC loop signal.

26. The system of claim 24 wherein said first multiplier and said second multiplier are monolithically integrated.

27. The system of claim 18 wherein said divider circuit outputs a corrected phase error signal and said corrected phase error signal, the system further comprising:
    a third filter that is operable to filter said corrected phase error signal to provide said tuning signal.

* * * * *